United States Patent
Essawy et al.

(10) Patent No.: US 11,639,954 B2
(45) Date of Patent: May 2, 2023

(54) DIFFERENTIAL LEAKAGE CURRENT MEASUREMENT FOR HEATER HEALTH MONITORING

(71) Applicant: Rosemount Aerospace Inc., Burnsville, MN (US)

(72) Inventors: Magdi A. Essawy, Lakeville, MN (US); Dennis A. Quy, Apple Valley, MN (US); Cuong Tho Huynh, Eagan, MN (US)

(73) Assignee: ROSEMOUNT AEROSPACE INC., Burnsville, MN (US)

( * ) Notice: Subject to any disclaimer, the term of this patent is extended or adjusted under 35 U.S.C. 154(b) by 953 days.

(21) Appl. No.: 16/425,695

(22) Filed: May 29, 2019

(65) Prior Publication Data

US 2020/0379027 A1 Dec. 3, 2020

(51) Int. Cl.
*B64D 15/12* (2006.01)
*G01R 31/00* (2006.01)
(Continued)

(52) U.S. Cl.
CPC ........... *G01R 31/008* (2013.01); *B64D 15/12* (2013.01); *B64D 45/00* (2013.01); *B64F 5/60* (2017.01);
(Continued)

(58) Field of Classification Search
CPC ...... G01R 31/50; G01R 31/52; G01R 31/008; B64F 5/60; H05B 3/56; H05B 2214/02;
(Continued)

(56) References Cited

U.S. PATENT DOCUMENTS 1,061,080 A * 5/1913 Jeffery ............... G04B 37/1446
968/353
3,795,652 A 3/1974 Sakamoto et al.
(Continued)

FOREIGN PATENT DOCUMENTS

CA 1311028 5/1989
CN 1330766 A 1/2002
(Continued)

OTHER PUBLICATIONS

P. Lu et al., "Real-Time Monitoring of Temperature Rises of Energized Transformer Cores With Distributed Optical Fiber Sensors," in IEEE Transactions on Power Delivery, vol. 34, No. 4, pp. 1588-1598, Aug. 2019, doi: 10.1109/TPWRD.2019.2912866. (Year: 2019).*

(Continued)

*Primary Examiner* — Cuong H Nguyen (74) *Attorney, Agent, or Firm* — Kinney & Lange, P.A.

(57) ABSTRACT

A system and method for monitoring the health of a heater connected to a power supply by a power cable that includes a first power lead conducting an inlet current having an inlet current direction, and a second power lead conducting an outlet current having an outlet current direction opposite to the inlet current direction. The power cable passes through a center region of a toroid core one or more times, and a secondary winding on the toroid core is configured to induce a secondary voltage indicative of a difference between the inlet current and the outlet current, which defines the leakage current. The system includes a prognostic processor that is configured to calculate a heater health indication based on the secondary voltage, which is indicative of the heater health.

19 Claims, 4 Drawing Sheets

(51) Int. Cl.
  *B64F 5/60* (2017.01)
  *G01R 31/50* (2020.01)
  *B64D 45/00* (2006.01)
  *G01P 13/02* (2006.01)
  *H05B 1/02* (2006.01)

(52) U.S. Cl.
  CPC ............ *G01P 13/025* (2013.01); *G01R 31/50* (2020.01); *H05B 1/0236* (2013.01); *B64D 2045/0085* (2013.01); *H05B 2214/02* (2013.01)

(58) Field of Classification Search
  CPC ...... H05B 1/0236; B64D 15/00; B64D 15/12; B64D 45/00; B64D 2045/0085; G01P 13/025; G01P 5/165; H04B 2211/02
  USPC .................................. 219/497; 324/511, 522
  See application file for complete search history.

(56) References Cited

U.S. PATENT DOCUMENTS

| | | |
|---|---|---|
| 3,798,652 A | 3/1974 | Williams |
| 4,121,088 A | 10/1978 | Doremus et al. |
| 4,207,566 A | 6/1980 | Gitlin et al. |
| 4,267,721 A | 5/1981 | Longenecker et al. |
| 4,506,259 A | 3/1985 | Rhodes |
| 4,698,583 A | 10/1987 | Sandberg |
| 5,130,652 A | 7/1992 | Kawakami et al. |
| 5,216,226 A | 6/1993 | Miyoshi |
| 5,218,294 A | 6/1993 | Soiferman |
| 5,464,965 A | 11/1995 | McGregor et al. |
| 5,767,781 A | 6/1998 | Yavelberg |
| 5,847,913 A * | 12/1998 | Turner ................... G01R 31/52 361/115 |
| 5,883,512 A | 3/1999 | Streit et al. |
| 5,942,682 A | 8/1999 | Ghetzler et al. |
| 5,986,444 A * | 11/1999 | Powell ................. G01R 15/205 324/252 |
| 6,070,475 A | 6/2000 | Muehlhauser et al. |
| 6,107,611 A | 8/2000 | Jones |
| 6,151,560 A | 11/2000 | Jones |
| 6,188,423 B1 | 2/2001 | Pou |
| 6,218,647 B1 | 4/2001 | Jones |
| 6,266,219 B1 | 7/2001 | Macbeth et al. |
| 6,270,460 B1 | 8/2001 | McCartan et al. |
| 6,300,767 B1 | 10/2001 | Kliman et al. |
| 6,336,083 B1 | 1/2002 | Lanham et al. |
| 6,370,450 B1 | 4/2002 | Kromer et al. |
| 6,400,334 B1 | 6/2002 | Lindenmeier et al. |
| 6,414,282 B1 | 7/2002 | Ice et al. |
| 6,414,508 B1 | 7/2002 | London |
| 6,430,996 B1 | 8/2002 | Anderson et al. |
| 6,476,624 B1 | 11/2002 | Chuman et al. |
| 6,543,298 B2 | 4/2003 | Cronin et al. |
| 6,560,551 B1 | 5/2003 | Severson et al. |
| 6,668,640 B1 | 12/2003 | Alwin et al. |
| 6,759,962 B2 | 7/2004 | Severson et al. |
| 6,906,537 B2 | 6/2005 | Goldberg et al. |
| 7,012,538 B2 | 3/2006 | Peck et al. |
| 7,193,428 B1 * | 3/2007 | Baron ............. G01R 19/16547 361/87 |
| 7,202,451 B2 | 4/2007 | Uchida et al. |
| 7,209,651 B1 | 4/2007 | Knoeppel et al. |
| 7,219,023 B2 | 5/2007 | Banke et al. |
| 7,256,372 B2 | 8/2007 | Knoeppel et al. |
| 7,490,510 B2 | 2/2009 | Agami et al. |
| 7,647,843 B2 | 1/2010 | Burton |
| 7,854,548 B2 | 12/2010 | Sandnas et al. |
| 7,915,567 B2 | 3/2011 | Lhuillier |
| 8,182,143 B2 | 5/2012 | Fleming et al. |
| 8,269,513 B2 | 9/2012 | Palm et al. |
| 8,466,390 B2 | 6/2013 | Gaertner, II et al. |
| 8,711,008 B2 | 4/2014 | Cook et al. |
| 8,890,703 B2 | 11/2014 | Farris et al. |
| 9,046,899 B2 | 6/2015 | Shearer et al. |
| 9,080,917 B2 | 7/2015 | Nguyen et al. |
| 9,463,879 B2 | 10/2016 | Khozikov et al. |
| 9,638,436 B2 | 5/2017 | Arensmeier et al. |
| 9,654,054 B1 | 5/2017 | Omoumi et al. |
| 9,733,135 B2 | 8/2017 | Feau et al. |
| 9,885,761 B2 | 2/2018 | Schram |
| 9,919,812 B2 * | 3/2018 | Shi ....................... G08B 21/182 |
| 9,927,480 B2 | 3/2018 | Nesnidal |
| 9,939,459 B2 | 4/2018 | Dichek |
| 10,132,824 B2 | 11/2018 | Benning et al. |
| 10,151,785 B2 * | 12/2018 | Essawy .................. G01J 5/025 |
| 10,180,449 B2 * | 1/2019 | Essawy ................. G01N 27/24 |
| 10,197,517 B2 * | 2/2019 | Essawy .................. G01P 5/165 |
| 10,564,203 B2 | 2/2020 | Essawy et al. |
| 10,895,592 B2 * | 1/2021 | Essawy ................. B64D 47/08 |
| 10,914,777 B2 * | 2/2021 | Essawy ................... H05B 3/00 |
| 10,962,580 B2 * | 3/2021 | Essawy ................ G01R 31/008 |
| 11,060,992 B2 * | 7/2021 | Fok ......................... H05B 3/56 |
| 11,061,080 B2 * | 7/2021 | Essawy .................. G01P 5/165 |
| 11,117,670 B2 * | 9/2021 | Shi ......................... B64D 15/12 |
| 11,293,995 B2 * | 4/2022 | Essawy ................. G01R 31/52 |
| 11,472,562 B2 * | 10/2022 | Essawy ................ G01P 21/025 |
| 2001/0054611 A1 | 12/2001 | Miyahara et al. |
| 2002/0078752 A1 | 6/2002 | Braunling et al. |
| 2002/0154029 A1 | 10/2002 | Watt et al. |
| 2003/0169031 A1 | 9/2003 | Viola |
| 2003/0206111 A1 | 11/2003 | Sao et al. |
| 2004/0024538 A1 | 2/2004 | Severson et al. |
| 2004/0032270 A1 | 2/2004 | Goldberg et al. |
| 2004/0075567 A1 | 4/2004 | Peck et al. |
| 2004/0124358 A1 | 7/2004 | Okamura et al. |
| 2004/0217106 A1 | 11/2004 | Giterman |
| 2004/0243949 A1 | 12/2004 | Wang et al. |
| 2005/0200363 A1 | 9/2005 | Hasegawa et al. |
| 2005/0231153 A1 * | 10/2005 | Dewey .............. H01M 8/04955 320/101 |
| 2005/0232331 A1 | 10/2005 | Severson |
| 2005/0232332 A1 | 10/2005 | Hanson et al. |
| 2006/0033504 A1 | 2/2006 | Barber et al. |
| 2006/0096971 A1 | 5/2006 | Reusche et al. |
| 2006/0133447 A1 | 6/2006 | Severson |
| 2006/0250143 A1 | 11/2006 | Moon et al. |
| 2007/0084857 A1 | 4/2007 | Osaka |
| 2007/0125764 A1 | 6/2007 | Knoeppel et al. |
| 2007/0208520 A1 | 9/2007 | Zhang et al. |
| 2008/0018340 A1 | 1/2008 | Arnou et al. |
| 2008/0112100 A1 | 5/2008 | Liu |
| 2008/0147255 A1 | 6/2008 | Alwin et al. |
| 2008/0151963 A1 | 6/2008 | Sandnas et al. |
| 2008/0183404 A1 | 7/2008 | Emami et al. |
| 2008/0250796 A1 | 10/2008 | Clugston et al. |
| 2009/0003408 A1 | 1/2009 | Severson |
| 2009/0055036 A1 | 2/2009 | Vozhdaev et al. |
| 2009/0065502 A1 | 3/2009 | Suenaga et al. |
| 2009/0251152 A1 | 10/2009 | Ammann |
| 2009/0321415 A1 | 12/2009 | Zhang et al. |
| 2010/0108662 A1 | 5/2010 | Taylor et al. |
| 2010/0156426 A1 | 6/2010 | Kang et al. |
| 2010/0163433 A1 | 7/2010 | Horn |
| 2010/0213960 A1 | 8/2010 | Mok et al. |
| 2010/0231249 A1 | 9/2010 | Dang et al. |
| 2011/0036160 A1 | 2/2011 | Pineau et al. |
| 2011/0058397 A1 | 3/2011 | Rizzo |
| 2011/0089958 A1 | 4/2011 | Malecki et al. |
| 2011/0106475 A1 | 5/2011 | Wigen |
| 2011/0118990 A1 | 5/2011 | Sidhu et al. |
| 2011/0290784 A1 | 12/2011 | Orawetz et al. |
| 2011/0320139 A1 | 12/2011 | Amir et al. |
| 2012/0133384 A1 | 5/2012 | Palais et al. |
| 2012/0213246 A1 | 8/2012 | Honbo et al. |
| 2012/0268074 A1 | 10/2012 | Cooley et al. |
| 2012/0319706 A1 | 12/2012 | Nadel et al. |
| 2013/0037535 A1 | 2/2013 | Ogasawara et al. |
| 2013/0039565 A1 | 2/2013 | Takeshima et al. |
| 2013/0194101 A1 | 8/2013 | Devupalli |
| 2013/0314082 A1 | 11/2013 | Lee et al. |
| 2014/0033175 A1 | 1/2014 | Lee et al. |
| 2014/0103938 A1 | 4/2014 | Jones |
| 2014/0238968 A1 | 8/2014 | Lee |

(56) References Cited

U.S. PATENT DOCUMENTS

| | | |
|---|---|---|
| 2014/0245830 A1 | 9/2014 | Martin et al. |
| 2014/0331751 A1 | 11/2014 | Macdonald |
| 2015/0014303 A1 | 1/2015 | Kohler et al. |
| 2015/0042980 A1 | 2/2015 | Liu et al. |
| 2015/0055940 A1 | 2/2015 | Steinhauser |
| 2015/0104888 A1 | 4/2015 | Lee |
| 2015/0123688 A1 | 5/2015 | Sappok et al. |
| 2015/0142343 A1 | 5/2015 | Zach et al. |
| 2015/0160148 A1 | 6/2015 | Stanley |
| 2015/0174843 A1 | 6/2015 | Crepin et al. |
| 2015/0237680 A1 | 8/2015 | Ono et al. |
| 2016/0013169 A1 | 1/2016 | Standing |
| 2016/0054233 A1 | 2/2016 | Bense et al. |
| 2016/0084986 A1 | 3/2016 | Zach et al. |
| 2016/0131690 A1 | 5/2016 | Ueno et al. |
| 2016/0131691 A1 | 5/2016 | Nesnidal |
| 2016/0178221 A1 | 6/2016 | Thornton et al. |
| 2016/0178680 A1 | 6/2016 | Ntziachristos |
| 2016/0255184 A1 | 9/2016 | Hwang |
| 2016/0280391 A1 | 9/2016 | Golly et al. |
| 2016/0291051 A1 | 10/2016 | Golly et al. |
| 2016/0313259 A1 | 10/2016 | Shayovitz |
| 2016/0338569 A1 | 11/2016 | Reder et al. |
| 2016/0364629 A1 | 12/2016 | Solli |
| 2016/0377487 A1 | 12/2016 | Cheung et al. |
| 2017/0037090 A1 | 2/2017 | Richmond et al. |
| 2017/0099699 A1 | 4/2017 | Nosrati et al. |
| 2017/0110887 A1 | 4/2017 | Bell et al. |
| 2017/0115139 A1 | 4/2017 | Wong et al. |
| 2017/0167925 A1 | 6/2017 | Safai et al. |
| 2017/0182447 A1 | 6/2017 | Sappok et al. |
| 2017/0191875 A1 | 7/2017 | Schmidt et al. |
| 2017/0215936 A1 | 8/2017 | Wallace |
| 2017/0259927 A1 | 9/2017 | Schram |
| 2017/0273142 A1 | 9/2017 | Denis et al. |
| 2017/0299626 A1 | 10/2017 | Dichek |
| 2017/0336156 A1 | 11/2017 | Phillips |
| 2017/0343418 A1 | 11/2017 | Hurbi et al. |
| 2017/0370748 A1 | 12/2017 | Fuller |
| 2017/0370960 A1 | 12/2017 | Benning et al. |
| 2017/0374296 A1 | 12/2017 | Schmidt |
| 2018/0026550 A1* | 1/2018 | Dent .................. H02J 7/0068 363/55 |
| 2018/0037338 A1* | 2/2018 | Shi .................. G01R 31/008 |
| 2018/0123441 A1 | 5/2018 | Yanai |
| 2018/0183404 A1 | 6/2018 | Jourdan et al. |
| 2018/0197350 A1 | 7/2018 | Kim et al. |
| 2018/0275080 A1 | 9/2018 | Essawy et al. |
| 2018/0275085 A1 | 9/2018 | Essawy et al. |
| 2018/0275181 A1 | 9/2018 | Essawy et al. |
| 2018/0275182 A1 | 9/2018 | Essawy et al. |
| 2018/0275183 A1 | 9/2018 | Essawy et al. |
| 2018/0275184 A1 | 9/2018 | Essawy et al. |
| 2018/0275185 A1 | 9/2018 | Essawy et al. |
| 2018/0290756 A1 | 10/2018 | White et al. |
| 2019/0297675 A1 | 9/2019 | Vadgaonkar et al. |
| 2019/0382139 A1 | 12/2019 | Shi |
| 2020/0011761 A1 | 1/2020 | Pado |
| 2020/0063682 A1 | 2/2020 | Boelke |
| 2020/0191850 A1* | 6/2020 | Essawy .................. G01P 5/165 |
| 2020/0191851 A1* | 6/2020 | Essawy .................. G01P 5/165 |
| 2020/0340889 A1 | 10/2020 | Mlcak et al. |
| 2020/0391871 A1* | 12/2020 | Essawy .................. G01P 5/165 |

FOREIGN PATENT DOCUMENTS

| | | |
|---|---|---|
| CN | 104296957 A | 1/2015 |
| CN | 105092050 A | 11/2015 |
| CN | 109246868 A | 1/2019 |
| CN | 109521252 A | 3/2019 |
| DE | 19833454 A1 | 2/2000 |
| EP | 1441429 A1 | 7/2004 |
| EP | 2755443 A2 | 7/2014 |
| EP | 3018057 A1 | 5/2016 |
| EP | 3281874 A1 | 2/2018 |
| EP | 3379261 A1 * | 9/2018 ............. B64D 15/12 |
| EP | 3379263 A1 * | 9/2018 ............. B64D 15/12 |
| EP | 3379265 A1 | 9/2018 |
| EP | 3379266 A1 | 9/2018 |
| EP | 3281874 B1 | 5/2020 |
| EP | 3745141 A1 | 12/2020 |
| GB | 809608 | 2/1959 |
| GB | 8884415 | 12/1961 |
| GB | 2561393 B | 12/2019 |
| JP | H0720577 U | 4/1995 |
| JP | 2006088391 A | 4/2006 |
| JP | 20121968123 A | 10/2012 |
| KR | 20110124542 A | 11/2011 |
| KR | 101110789 B1 | 2/2012 |
| KR | 20120062301 A | 6/2012 |
| WO | 09011532 A1 | 10/1990 |
| WO | 09816837 A1 | 4/1998 |
| WO | 9943066 A1 | 8/1999 |
| WO | 2011026740 A1 | 3/2011 |
| WO | 2013107371 A1 | 7/2013 |
| WO | WO-2021201663 A1 * | 10/2021 ............. G01P 5/165 |

OTHER PUBLICATIONS

L. Chen, G. R. Nagendra, J. T. Boys and G. A. Covic, "Double-Coupled Systems for IPT Roadway Applications," in IEEE Journal of Emerging and Selected Topics in Power Electronics, vol. 3, No. 1, pp. 37-49, Mar. 2015, doi: 10.1109/JESTPE.2014.2325943.(Year: 2015).*

J. M. Miller and A. Daga, "Elements of Wireless Power Transfer Essential to High Power Charging of Heavy Duty Vehicles," in IEEE Transactions on Transportation Electrification, vol. 1, No. 1, pp. 26-39, Jun. 2015, doi: 10.1109/TTE.2015.2426500.(Year: 2015).*

A. Trigui et al., "Generic Wireless Power Transfer and Data Communication System Based on a Novel Modulation Technique," in IEEE Transactions on Circuits and Systems I: Regular Papers, vol. 67, No. 11, pp. 3978-3990, Nov. 2020, doi: 10.1109/TCSI.2020.3010308 (Year: 2020).*

M. Borghei and M. Ghassemi, "Insulation Materials and Systems for More- and All-Electric Aircraft: A Review Identifying Challenges and Future Research Needs," in IEEE Transactions on Transportation Electrification, vol. 7, No. 3, pp. 1930-1953, Sep. 2021, doi: 10.1109/TTE.2021.3050269. (Year: 2021).*

"Elements of Wireless Power Transfer Essential to High Power Charging of Heavy Duty Vehicles" by John M. Miller et al, IEEE Transactions on Transportation Electrification, vol. 1, No. 1, Jun. 2015 (Year: 2015).*

"Generic Wireless Power Transfer and Data Communication System Based on a Novel Modulation Technique" by Aref Trigui et al, IEEE Transactions on Circuits and Systems-I: Regular Papers, vol. 67, No. 11, Nov. 2020 (Year: 2020).*

"Real-time monitoring of temperature rises of energized transformer cores with distributed optical fiber sensors" by Ping Lu et al, IEEE Trans on Power Delivery, vol. 34, n. Aug. 4, 2019 (Year: 2019).*

Extended European Search Report dated Sep. 1, 2021 for corresponding European Application No. 21169946.7, seven pages.

Extended European Search Report dated Jul. 26, 2021, received for corresponding European Application No. 21164413.3, eight pages.

Extended European Search Report for European Patent Application No. 19215831.9, dated Jul. 3, 2020, 11 pages.

Extended European Search Report for European Patent Application No. 19216159.4, dated May 28, 2020. 9 pages.

Taheri S. et al.: "Equivalent Surface conductivity of ice accumulated on insulators during development of AC and DO flashovers arcs", IEEE Transactions on Dielectrics, IEEE Service Center, Piscataway S, vol. 20, No. 5 Oct. 1, 2013, pp. 1789-1798.

Chen, L., et al., "Double-Coupled Systems for IPT Roadway Applications", L. Chen, G. R. Nagendra, J. T. Boys and G. A. Covic, "Double-Coupled Systems for IPT Roadway Applications," in IEEE Journal of Emerging and Selected Topics in Power Electronics, vol. 3, No. 1, pp. 37-49, Mar. 2015, doi: 10.1109/JESTPE.2014.2325943., Mar. 2015, 37-49.

(56) References Cited

OTHER PUBLICATIONS

Lu, P., et al., "Real-Time Monitoring of Temperature Rises of Energized Transformer Cores With Distributed Optical Fiber Sensors", P. Lu et al., "Real-Time Monitoring of Temperature Rises of Energized Transformer Cores With Distributed Optical Fiber Sensors," in IEEE Transactions on Power Delivery, vol. 34, No. 4, pp. 1588-1598, Aug. 2019, doi: 10.1109/TPWRD.2019.2912866., Aug. 2019.
Miller, J. M., et al., "lements of Wireless Power Transfer Essential to High Power Charging of Heavy Duty Vehicles", J. M. Miller and A. Daga, "Elements of Wireless Power Transfer Essential to High Power Charging of Heavy Duty Vehicles," in IEEE Transactions on Transportation Electrification, vol. 1, No. 1, pp. 26-39, Jun. 2015, doi: 10.1109/TTE.2015.2426500., Jun. 2015, 26-39.
Trigui, A. , et al., "Generic Wireless Power Transfer and Data Communication System Based on a Novel Modulation Technique", A. Trigui et al., "Generic Wireless Power Transfer and Data Communication System Based on a Novel Modulation Technique," in IEEE Transactions on Circuits and Systems I: Regular Papers, vol. 67, No. 11, pp. 3978-3990, Nov. 2020,, Nov. 2020, 3978-3990.
Bechhoefer, John, et al. "Temperature Dependence of the Capacitance of a Ferroelectric Material." in: American Journal of Physics (2007), vol. 75, No. 11, pp. 1046-1053.
Extended European Search Report for European Patent Application No. 18153822.4, dated May 17, 2018, 9 pages.
Communication Pursuant to Article 94(3) EPC for European Patent Application No. 18153822.4, dated Jan. 16, 2020, 4 pages.
Extended European Search Report for European Patent Application No. 18153825.7, dated Apr. 9, 2018, 7 pages.
Extended European Search Report for European Patent Application No. 19207401.1, dated Jan. 27, 2020, 8 pages.
Extended European Search Report for European Patent Application No. 18153830.7, dated May 23, 2018, 9 pages.
Extended European Search Report for European Patent Application No. 18153832.3, dated May 24, 2018, 9 pages.
Extended European Search Report for European Patent Application No. 19205621.6, dated Nov. 22, 2019, 9 pages.
Extended European Search Report for European Patent Application No. 18153834.9, dated May 29, 2018, 9 pages.
Extended European Search Report for European Patent Application No. 19203208.4, dated Nov. 18, 2019, 7 ages.
Extended European Search Report for European Patent Application No. 18153824.0, dated May 17, 2018, 9 pages.
Communication Pursuant to Article 94(3) EPC for European Patent Application No. 18153824.0, dated Jun. 12, 2019, 7 pages.
Communication Pursuant to Article 94(3) EPC for European Patent Application No. 18153824.0, dated Jan. 16, 2020, 5 pages.
Extended European Search Report for European Patent Application No. 18162251.5, dated Jul. 5, 2018, 9 pages.
Communication Pursuant to Article 94(3) EPC for European Patent Application No. 18162251.5, dated Jun. 12, 2019, 3 pages.
Cedric Gillet and Andreas Freidrich, "Guidelines for Designing a Concentrator for High-Current Sensing Applications with an Allegro Hall-Effect Sensor IC", 2013, 7 pages.
Magnetics Division of Sprang & Company, Technical Bulletin "Magnetic Cores for Hall Effect Devices", 1997, 6 pages.
Extended European Search Report dated May 4, 2020, received for corresponding European application No. 19214929.2, 40 pages.
Extended European Search Report for European Patent Application No. 19213783.4, dated Jun. 23, 2020, 7 pages.
Extended European Search Report for European Patent Application No. 19216276.6, dated Jul. 6, 2020, 10 pages.

\* cited by examiner

DIFFERENTIAL LEAKAGE CURRENT MEASUREMENT FOR HEATER HEALTH MONITORING

CROSS-REFERENCE TO RELATED APPLICATION(S)

This application is related to U.S. patent application Ser. No. 16/220,850, entitled "REAL TIME OPERATIONAL LEAKAGE CURRENT MEASUREMENT FOR PROBE HEATER PHM AND PREDICTION OF REMAINING USEFUL LIFE", filed Dec. 14, 2018.

BACKGROUND

The present disclosure relates generally to probes, and in particular, to a prognostic system for air data probe heaters.

Probes are utilized to determine characteristics of an environment. In aircraft systems, for example, air data probes may be implemented on the external portions of the aircraft to aid in determination of conditions such as airspeed, altitude, and angle of attack, among others. Air data probes are prone to ice accretion during flight, which can affect their performance. Accordingly, electrical heaters are integrated into modern air data probes for helping control ice build-up.

Being exposed to harsh environmental conditions and temperature extremes, the electric heaters in air data probes are prone to degradation over time, possibly leading to their ultimate failure. When an air data probe heater fails, the performance of the air data probe can be affected. Moreover, a failed air data probe can ground a flight, thereby impacting flight scheduling. It is desirable to be able to predict when an air data probe heater will require replacement, thereby mitigating the aforementioned impact on an aircraft's operation.

SUMMARY

A system for monitoring a health of a heater connected to a power supply by a power cable that includes a first power lead conducting an inlet current having an inlet current direction, and a second power lead conducting an outlet current having an outlet current direction opposite to the inlet current direction. The system includes a differential current inductive sensor which includes a toroid core defining a center region whereby the power cable is configured to pass through the center region one or more times, and a secondary winding having a number of secondary turns whereby the secondary winding is configured to induce a secondary voltage indicative of a difference between the inlet current and the outlet current. The system also includes a prognostic processor that is configured to calculate a heater health indication based on the secondary voltage. The difference between the inlet current and the outlet current defines a leakage current, which is indicative of the heater health.

A method of providing a heater health indication of a heater connected to a power supply by a power cable that includes a first power lead conducting an inlet current having an inlet current direction, and a second power lead conducting an outlet current having an outlet current direction opposite to the inlet current direction. The power cable passes through a center region of a toroid core having a secondary winding having a number of secondary turns, whereby the secondary winding is configured to induce a secondary voltage indicative of a difference between the inlet current and the outlet current. The method includes supplying electrical power from a power source to a heater via the power cable whereby the inlet current flows through the first power lead and the outlet current flows through the second power lead, and calculating, by a prognostic processor, a heater health indication based on the secondary voltage. The difference between the inlet current and the outlet current defines a leakage current, which is indicative of the heater health.

DETAILED DESCRIPTION

Figure 1:
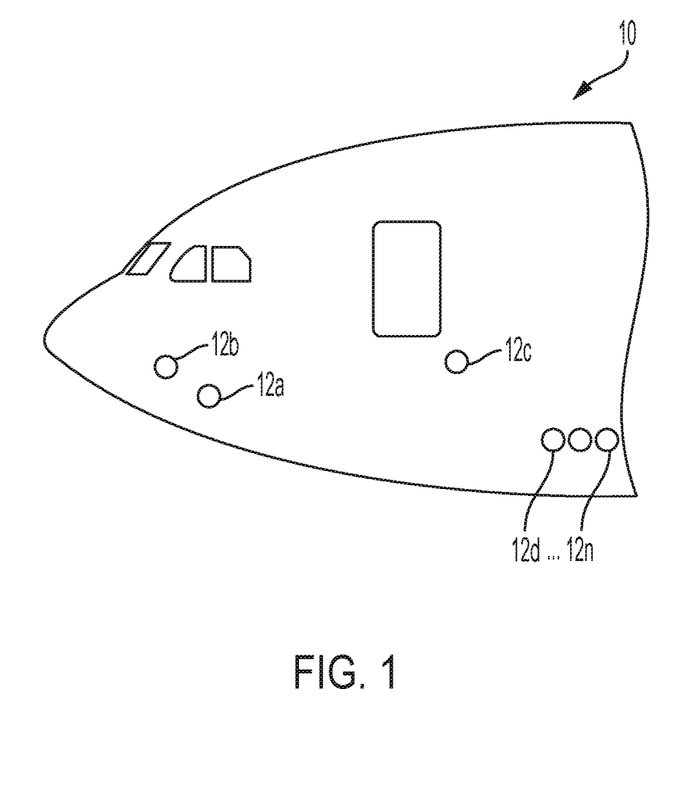
FIG. 1 is a schematic diagram illustrating an aircraft that includes a plurality of air data probes.

FIG. 1 is a schematic diagram illustrating aircraft 10 that includes a plurality of air data probes 12a-12n. Air data probes 12a-12n can be any type of probe with non-limiting examples including pitot probes, pitot-static probes, total air temperature (TAT) probes, or angle-of-attack (AOA) sensors. Any number n of air data probes can be included on a particular aircraft, with each air data probe 12a-12n typically including an integrated heater to control icing. As used in the present disclosure, one of any air data probes 12a-12n can be referred to as air data probe 12. The exemplary embodiment shown in FIG. 1 is a commercial fixed-wing aircraft. Air data probe 12 can be used on other vehicles, with non-limiting examples including military aircraft, rotary wing aircraft, unmanned aerial vehicles, spacecraft, and ground vehicles.

Figure 2A:
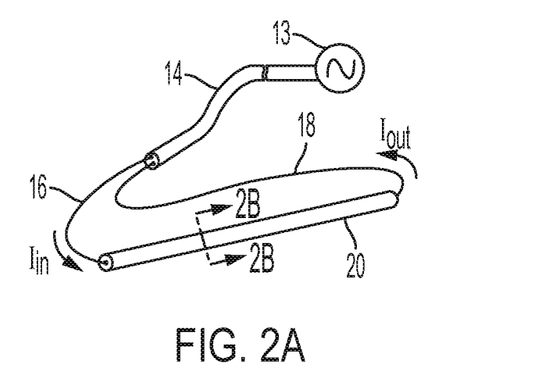
FIG. 2A is a schematic diagram of an air data probe heater circuit.

FIG. 2A is a schematic diagram of an air data probe heater circuit. Shown in FIG. 2A are aircraft power supply 13, power cable 14, first power lead 16, second power lead 18, and heater 20. Also labeled in FIG. 2A are inlet current $I_{in}$ and outlet current $I_{out}$. Aircraft power supply 13 provides electrical power via power cable 14. In the illustrated embodiment, aircraft power supply 13 provides 115 VAC at 400 Hz. First power lead 16 and second power lead 18 together provides an electrical connection to heater 20, thereby allowing electrical current to flow through heater 20. Heater 20 can be referred to as an air data probe heater. In a typical embodiment, heater 20 can consume 200-300 Watts in converting electrical power into thermal power. Heater 20 is typically integrated into air data probe 12, and is energized (i.e., powered) to reduce or prevent ice formation on the respective air data probe by raising the surface temperature of the air data probe to a value that can melt and/or control the formation of ice on air data probe 12. Inlet current $I_{in}$ flows into heater 20 through first power lead 16, and outlet current $I_{out}$ flows from heater 20 through second power lead 18, as shown in FIG. 2A. The directions of current flow $I_{in}$, $I_{out}$ are illustrative, using a convention that is used in the electrical art. Under ideal circumstances, $I_{in}$ and $I_{out}$ are approximately equivalent, meaning that there is no other path for current to flow from heater 20. However, heater 20 is prone to failure, as will be described in detail later in FIGS. 3-4. A failure of heater 20 can typically require a replacement of the associated air data probe. It is to be appreciated that the illustrated embodiment is greatly simplified, and associated control circuitry, circuit breakers, and the like are not shown. Moreover, the values provided for power supply voltage and frequency, and heater power consumption, are exemplary and can be different in various embodiments.

Figure 2B:
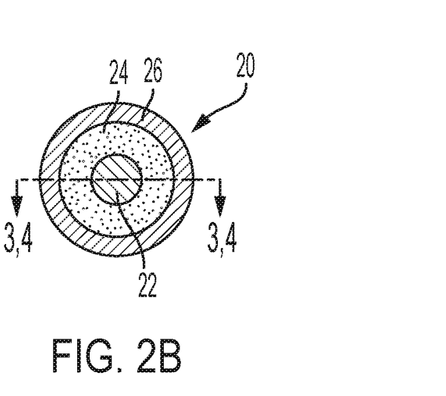
FIG. 2B is a cross-sectional view of the air data probe heater taken along line 2B-2B of FIG. 2A.

FIG. 2B is a cross-sectional view of an air data probe heater taken along line 2B-2B of FIG. 2A. Shown in FIG. 2B are heater 20, resistive heating element 22, insulation 24, and sheath 26. In the illustrated embodiment, resistive heating element 22 is made of an oxidation-resistant alloy. Insulation 24 surrounds resistive heating element 22. Insulation 24 is an electrically-insulating material that provides heat conduction outward from resistive heating element 22. Sheath 26 is an oxidation-resistant metallic material that surrounds insulation 24, thereby containing insulation 24 while providing thermal conductivity from heater 20 to the air data probe in which heater 20 is installed. Sheath 26 can be referred to as a metallic sheath. It is to be appreciated that the various materials are selected to provide various desirable properties (e.g., strength, thermal conductivity, oxidation resistance), while also optimizing service life. Notwithstanding, heater 20 is prone to failure over time, as will be described in more detail later in regard to FIGS. 3-4.

Figure 3:
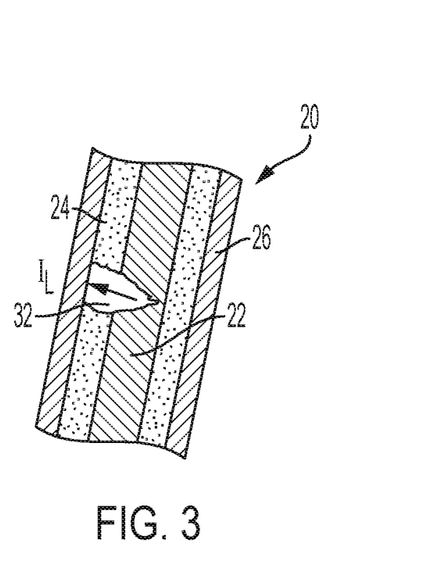
FIG. 3 is a partial cross-sectional view illustrating the air data probe heater with compromised resistive heating element taken along line 3-3 of FIG. 2B.
Figure 4:
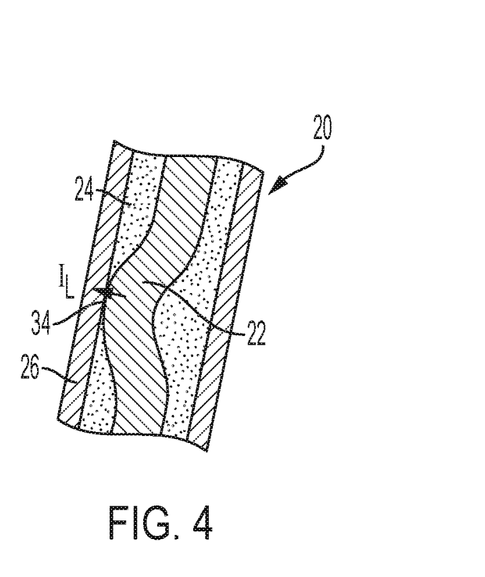
FIG. 4 is a partial cross-sectional view illustrating the air data probe heater with a compromised insulation taken along line 4-4 of FIG. 2B.

FIG. 3 is a partial cross-sectional view illustrating heater 20 with compromised resistive heating element taken along line 3-3 of FIG. 2B. FIG. 4 is a partial cross-sectional view illustrating heater 20 with a compromised insulation taken along line 4-4 of FIG. 2B. FIGS. 3-4 illustrate exemplary modes of failure of heater 20, as will be described, while other failure mechanisms for heater 20 can also result in various embodiments. Shown in FIGS. 3-4 are heater 20, resistive heating element 22, insulation 24, sheath 26, compromised insulation 32, and compromised heating element 34. If sheath 26 is compromised, contaminants can leak through sheath 26 to insulation 24, causing the material of insulation 24 to oxidize, change properties, and/or otherwise break down, thereby causing a path for leakage current $I_L$ to flow from resistive heating element 22 to sheath 26. Non-limiting examples of contaminants include oxygen, moisture, dust, carbon, fuel, oil, deicing fluid, and combustion products. Non-limiting examples of events that can compromise sheath 26 include external damage, latent defects, and fatigue failure (e.g., from vibration). Contaminants can also affect resistive heating element 22, leading to the failure of resistive heating element 22. Compromised heating element 34 can result from a number of causes, with non-limiting examples including mechanical damage, fatigue failure, thermal expansion, oxidation, and damage to sheath 26. As the extent of compromised heating element 34 grows over time, a path is created for leakage current ($I_L$) to flow from resistive heating element 22 to sheath 26. Ultimately, an electrical short circuit can develop between resistive heating element 22 and sheath 26. In some circumstances, compromised heating element 34 can manifest as an open circuit in resistive heating element 22.

Figure 5:
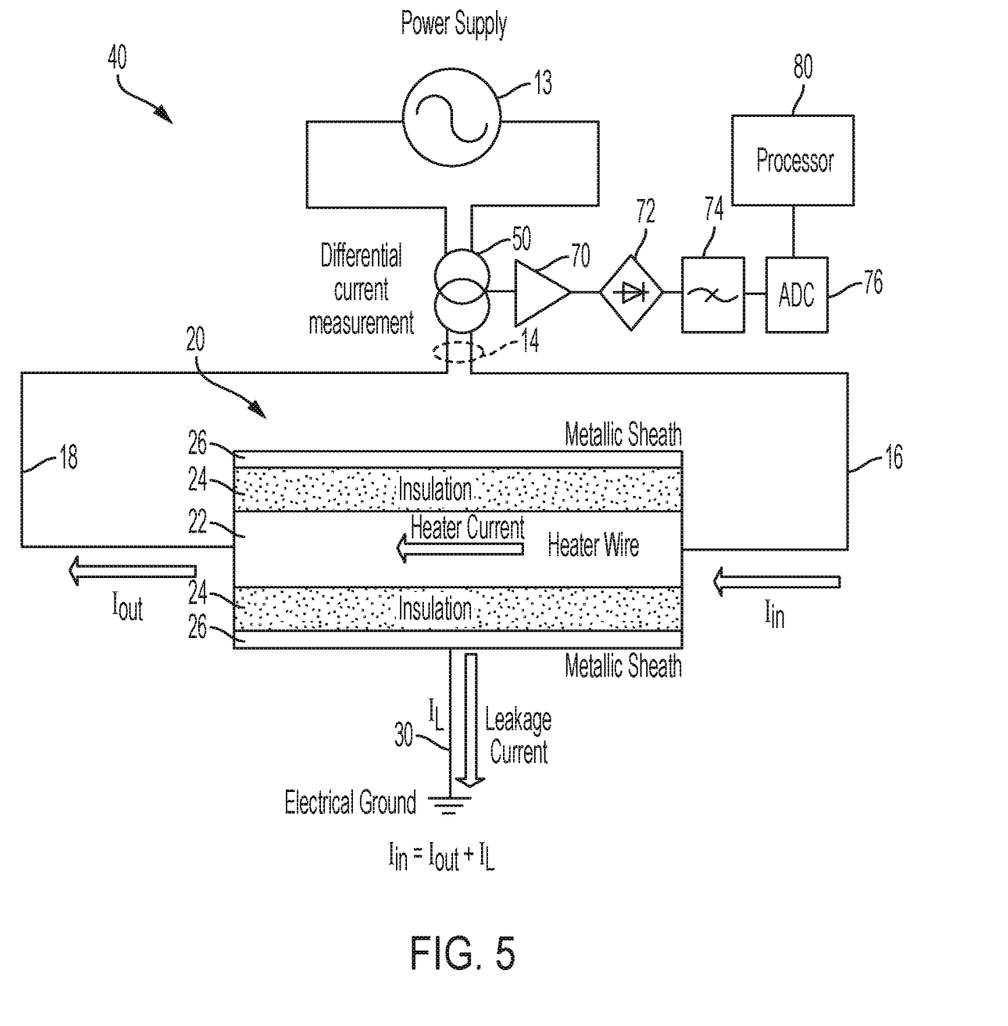
FIG. 5 is a schematic diagram of a differential leakage current health monitoring system.

FIG. 5 is a schematic diagram of a differential leakage current health monitoring system. Shown in FIG. 5 are aircraft power supply 13, power cable 14, first power lead 16, second power lead 18, and heater 20, resistive heating element 22, insulation 24, sheath 26, health monitoring system 40, differential current inductive sensor 50, amplifier 70, rectifier 72, filter 74, analog-to-digital converter 76, and prognostic processor 80. Also labeled in FIG. 5 are inlet current $I_{in}$, outlet current $I_{out}$, and leakage current $I_L$. Power cable 14 is depicted schematically, representing an unspecified length of a two-conductor cable that provides power lead 16 and second power lead 18. The descriptions of aircraft power supply 13, power cable 14, first power lead 16, second power lead 18, and heater 20, resistive heating element 22, insulation 24, and sheath 26 are substantially as provided above in regard to FIGS. 2A-2B. When heater 20 is operating normally, inlet current $I_{in}$ flows into resistive heating element 22 (i.e., heater 20) through first power lead 16, and outlet current $I_{out}$ flows from resistive heating element 22 through second power lead 18, with $I_{in}$ being approximately equal to $I_{out}$ as described above in regard to FIG. 2A. A typical value of current flow (i.e., $I_{in}$, $I_{out}$) can range from about 1-3 amps (A). A small amount of leakage current $I_L$ flows through leakage current path 30, schematically represented as flowing from sheath 26 to ground (i.e., chassis ground). The relationship between inlet current $I_{in}$, outlet current $I_{out}$, and leakage current $I_L$ can be calculated as follows:

$$I_{in} = I_{out} + I_L \quad \text{(Equation 1)}$$

It is to be appreciated that a properly functioning heater 20 will experience a nominal value of leakage current $I_L$ by virtue of the nature of insulation 24. When a newly-manufactured heater 20 and associated air data probe is installed, the baseline value of leakage current $I_L$ is typically measured and recorded. This can be referred to as the baseline leakage current $I_{L\text{-}baseline}$, or as the leakage current $I_L$ at inception. A typical value of baseline leakage current $I_{L\text{-}baseline}$ can range from about 0.2-50 microamps (μA), but this value can vary over a wide range depending on the particular embodiment of heater 20. For example, in some embodiments, baseline leakage current $I_{L\text{-}baseline}$ can range up to about 2 milliamps (mA), or higher. In other embodiments, baseline leakage current $I_{L\text{-}baseline}$ can be less than 0.2 μA. As heater 20 operates, it is normal for of leakage current $I_L$ to gradually increase as a result of minor degradation of insulation 24. The normal migration of environmental impurities into insulation 24 is a non-limiting example of a normal degradation of insulation 24, over the lifetime of a particular heater 20. Because heater 20 is typically powered when an aircraft is flying, an expected heater lifetime can be expressed as a measure of flight hours. Several factors (e.g., size of heater 20, physical location of heater 20) can affect the expected lifetime of heater 20 in a particular embodiment, with typical values ranging from about 13K-100K flight hours. Heater end-of-life (EOL) is typically associated with a particular threshold value $I_{L\text{-}threshold}$, which can vary depending on the particular embodiment of heater 20. Exemplary values of threshold value $I_{L\text{-}threshold}$ can range from about 2-50 mA. The relationship between leakage current $I_L$, service life, and expected lifetime can be determined for a particular embodiment of heater 20. Accordingly, the remaining useful life (RUL) can be estimated from a particular value of leakage current $I_L$. Accordingly, it is the object of the present disclosure to provide a system and method of measuring the value of leakage current $I_L$ throughout the service life of heater 20, thereby providing an indication of RUL while also identifying an abnormal condition that could be indicative of a premature failure of heater 20. It is desirable to replace an air data probe (i.e., and associated heater 20) prior to the EOL or prior to the point of failure, to avoid an operational delay and interruption (ODI) that could result following a failure. On the other hand, because replacing an air data probe (i.e., and associated heater 20) can be expensive in terms of time and cost, while also removing the associated aircraft from operation, it is desirable to extract the maximum useful service life from heater 20 prior to the point of replacement.

Referring again to FIG. 5 and Equation 1, the value of leakage current $I_L$ can be expressed as being the difference between inlet current $I_{in}$ and outlet current $I_{out}$, as follows:

$$I_L = I_{in} - I_{out} \qquad \text{(Equation 2)}$$

Differential current inductive sensor 50 produces an electrical signal representing the value of leakage current $I_L$, the detail of which will be shown and described later in FIG. 6. Differential current inductive sensor 50 can also be called an inductive leakage current sensor or a differential leakage current inductive sensor. The electrical signal representing the value of leakage current is amplified by amplifier 70, rectified by rectifier 72, and filtered by filter 74, thereby producing a DC voltage level that is representative of the value of leakage current $I_L$. Analog-to-digital converter 76 produces a digital signal representing the DC voltage level provided by filter 74 (i.e., the value of leakage current $I_L$). This can be referred to as a digitized leakage current value. In the illustrated embodiment, amplifier 70 is an operational amplifier, with rectifier 72 and filter 74 providing AC-to-DC conversion. In other embodiments, other circuit components that perform similar functions can be used. For example, amplifier 70 can be any electronic circuit that provides amplification, rectifier 72 can be any nonlinear component that provides rectification, and filter 74 can be any component that filters the rectified value. In yet other embodiments, AC-to-DC conversion can be omitted, with an AC voltage being provided from amplifier 70 directly to prognostic processor 80.

Referring again to FIG. 5, prognostic processor 80 is a digital processor that receives, stores, scales, and processes the digitized leakage current value that is received throughout the lifecycle of heater 20. Prognostic processor 80 can receive and process the digitized leakage current value continuously or periodically. In the illustrated embodiment, prognostic processor 80 can include one or more processors (not shown in FIG. 5) that are configured to implement functionality and/or process instructions for execution within prognostic processor 80. The one or more prognostic processor(s) can be capable of processing instructions stored in one or more storage device(s) (not shown in FIG. 5). Examples of processor(s) can include any one or more of a microprocessor, a controller, a digital signal processor (DSP), an application specific integrated circuit (ASIC), a field-programmable gate array (FPGA), or other equivalent discrete or integrated logic circuitry. In some embodiments, prognostic processor 80 can receive multiple inputs corresponding to digitized leakage current values from multiple associated heaters 20. In other embodiments, prognostic processor 80 can receive other inputs associated with heater 20, with non-limiting examples including inlet current $I_{in}$ and/or outlet current $I_{out}$, and/or the voltage level (not labeled in FIG. 5) of power supply 13. In yet other embodiments, prognostic processor 80 can also receive and process data from sources other than leakage current $I_L$ associated with one or more heaters 20. In an exemplary embodiment, prognostic processor 80 can receive data from other aircraft data sources. In some embodiments, prognostic processor 80 can utilize data and signal analysis processing techniques on digitized leakage current values. In these or other embodiments, prognostic processor 80 can be a neural network. In some embodiments, prognostic processor 80 can provide information regarding one or more heaters 20 including the current value of leakage current $I_L$, the history of leakage current $I_L$ over time (e.g., operating time or calendar time), the service life of heater 20 (i.e., operating time), the expected EOL, and the calculated RUL. The aforementioned data can be provided to other systems (e.g., avionics system) for use by crew members. In these or other embodiments, prognostic processor 80 can provide data that can be transmitted and/or downloaded to engineering teams at an airline's operator, maintenance facility, and/or the various component suppliers whereby the data can be reviewed, analyzed, and/or archived.

When installed on a system that includes one or more heaters 20, health monitoring system 40 can track the health of each heater 20 in the system, allowing maintenance personnel to predict when failure is likely to occur so that maintenance can be scheduled prior to the point of expected failure for any particular heater 20. This can avoid flight delays that could ground an aircraft for emergent maintenance requirements, and it can also help prevent the in-flight failure of a particular heater 20 that could be disruptive to the performance of an associated air data probe 12. The exemplary embodiment of differential current inductive sensor 50 and associated health monitoring system 40 is on heater 20 as used on an air data probe 12 (e.g., as on aircraft 10 shown in FIG. 1). The scope of the present disclosure includes the usage of health monitoring system 40 on any AC-powered electrical heater, without regard to voltage, frequency, and/or power, regardless of location. Accordingly, health monitoring system 40 can be used on one or more heaters 20 that are located or installed in any vehicle, building, or other location. Non-limiting examples of other types of heaters include wing ice protection heaters, water heaters, and floor heaters. The scope of the present disclosure also includes insulation health monitoring on other electrical systems including, for example, cables, motors, and transformers.

Figure 6:
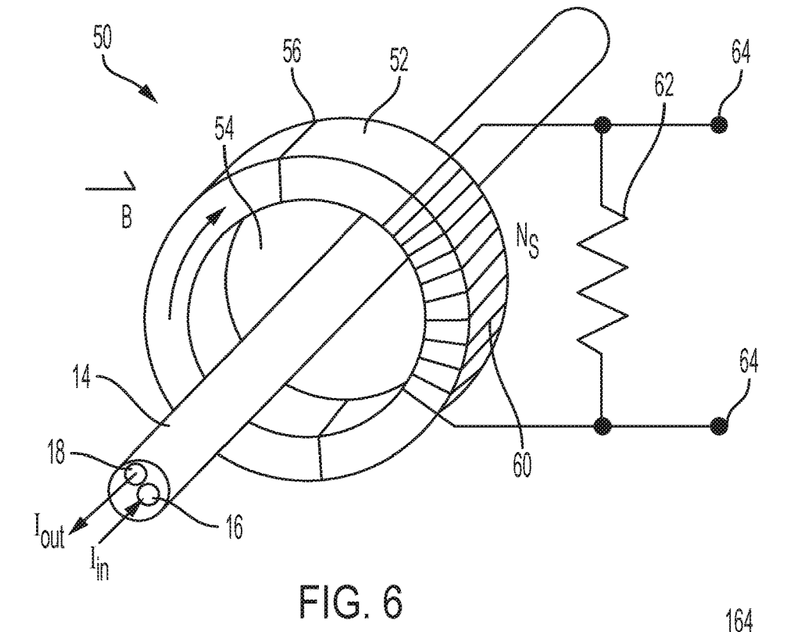
FIG. 6 is a schematic diagram of the differential current inductive sensor shown in FIG. 5.

FIG. 6 is a schematic diagram of differential current inductive sensor 50 shown in FIG. 5. Shown in FIG. 6 are differential current inductive sensor 50, toroid core 52, toroid center region 54, toroid split 56, secondary winding 60, resistor 62, and secondary voltage terminals 64. Power cable 14 provides an electrical connection between aircraft power supply 13 and heater 20, as shown and described above in regard to FIGS. 2A and 5. First power lead 16 and second power lead 18 each include a central conductive core that is surrounded by an insulating material, together being held together by an outer cable sheath (not labeled) to form power cable 14. The insulating material on first and second power leads 16, 18, and the outer cable sheath, are all nonmetallic in the region near differential current inductive sensor 50, thereby providing negligible electromagnetic shielding. In some embodiments, the outer cable sheath on power cable 14 can be omitted. In these or other embodiments, first power lead 16 and second power lead 18 can be twisted together, or they can be untwisted. Toroid core 52 defines toroid center region 54, thereby providing for the passage of wires, cables, and the like. In the illustrated embodiment, toroid core 52 has torrid split 52, thereby allowing toroid core 52 to be opened and/or separated into two halves (not labeled in FIG. 6). In some embodiments, toroid split 56 can be omitted from toroid core 52. Power cable 14 can be described as passing through toroid center region 54, as shown in FIG. 6. Power cable 14 can also be described as traversing toroid center region 54.

Referring again to FIG. 6, toroid core 52 is an iron core transformer. In an exemplary embodiment, toroid core 52 is a ferrite core, made from a material that has a relatively high value of magnetic permeability, as may be commonly used in the electrical art as a transformer core. Toroid core 52 can be referred to as a circular transformer core. In some embodiments, toroid core can be made from other materials that are capable of providing electromagnetic coupling, as will be described. The number of turns of the primary ($N_P$) and secondary ($N_S$) winding on toroid core 52, and the electrical wire thickness and insulation, are designed according to the current transformer known design principles. It is known in the electrical art that an alternating current flowing in a conductor passing through a ferrite core induces an alternating magnetic flux 1 (not labeled), thereby creating an alternating magnetic field B, which induces an alternating current in secondary winding 60. The alternating magnetic field B can be annotated with a vector symbol, as shown in FIG. 6. As electrical power is delivered to heater 20 by power cable 14 (e.g., as shown in FIG. 5), inlet current $I_{in}$ flows through power cable 14 in a direction that is opposite to that of outlet current $I_{out}$, with both inlet current $I_{in}$ and outlet current $I_{out}$ flowing through toroid center region 54. Accordingly, the component of alternating magnetic field B associated with inlet current $I_{in}$ is opposite in direction to the component of alternating magnetic field B associated with outlet current $I_{in}$. The difference between inlet current $I_{in}$ and outlet current $I_{out}$ is measured through toroid core 52 primary winding (i.e., power cable 14) and transformed by toroid core 52 to secondary winding 60. This will result in a secondary voltage ($V_S$) value at secondary voltage terminals 64 that is representative of the differential current (i.e., $I_{in}-I_{out}$) flowing through power cable 14 (i.e., primary winding). It is to be appreciated that if inlet current $I_{in}$ were equal to outlet current $I_{out}$ (i.e., $I_{in}=I_{out}$), then the resulting alternating magnetic field B would be zero because the respective components of alternating magnetic fields B from inlet current $I_{in}$ and outlet current $I_{out}$ are equal in magnitude but opposite in direction. Because leakage current $I_L$ is non-zero as a result of the properties of heater 20, as described above in regard to FIG. 5, the resulting alternating magnetic field B that is induced in differential current inductive sensor 50 is proportional to the value of leakage current $I_L$, as shown by Equation 2 above. Accordingly, a secondary voltage ($V_S$) is induced in secondary winding 60 that is proportional in magnitude to both leakage current $I_L$, and to the number of primary turns $N_P$ and the number of secondary turns $N_S$. It is to be appreciated that in the embodiment, about twelve secondary turns $N_S$ are shown for simplicity. In some embodiments, a greater number of secondary turns $N_S$ can be used to induce a greater secondary voltage ($V_S$) in secondary winding 60. In an exemplary embodiment, the number of secondary turns $N_S$ can range from about 100-3000. In other embodiments, the number of secondary turns $N_S$ can be fewer than 100 or greater than 3000.

Referring again to FIG. 6, the induced secondary voltage $V_S$ results in current flowing through resistor 62, thereby developing a voltage potential that can be measured at secondary voltage terminals 64. Resistor 62 can be referred to as a burden resistor or output resistor. Accordingly, the secondary voltage at secondary voltage terminals 64 provides an indication that is proportional to the value of leakage current $I_L$. The present embodiment, as shown in FIG. 5, includes amplifier 70, rectifier 72, filter 74, and analog-to-digital converter 76 which together provide a digital signal that is representative of the value of leakage current $I_L$. Accordingly, the secondary voltage at secondary voltage terminals 64 is provided as an input to amplifier 70 shown in FIG. 5.

In a particular embodiment, differential current inductive sensor 50 can be installed while air date probe 12 and associated heater 20 are installed on aircraft 10 by passing power cable 14 through toroid center region 54 prior to completing the electrical connections to power cable 14. In the illustrated embodiment, toroid core 52 includes toroid split 56 which allows differential current inductive sensor 50 to be installed on an existing power cable 14 by opening toroid core 52 at toroid split 56 to allow toroid core 52 to be placed around an existing power cable 14, then rejoining toroid core 52. It is to be appreciated that various means of holding together toroid core 52 having toroid split 56 can be used, and are not shown in FIG. 6. The resulting configuration in which differential current inductive sensor 50 is installed over an existing power cable 14 can be used on an aircraft (e.g., aircraft 10, as shown in FIG. 1) having installed air data probes 12. The aforementioned method of placing toroid core 52 around an existing power cable 14 can also be used on newly-installed air data probes 12, for example, where power cable 14 is installed in place. Accordingly, the scope of the present disclosure applies to both new installations and the installation on installed equipment. It is to be appreciated that in a particular embodiment, whereby differential current inductive sensor 50 and health monitoring system 40 is installed on an existing (i.e., already in-service) air data probe 12, leakage current $I_L$ that is first measured by health monitoring system 40 will be indicative of a value corresponding to an in-service heater 20.

Figure 7:
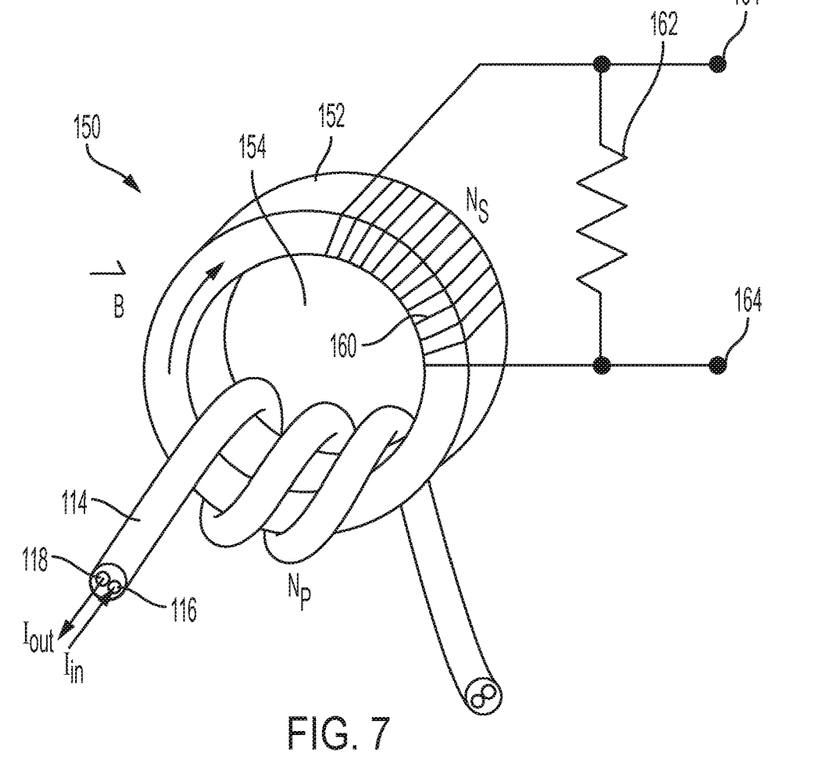
FIG. 7 is a schematic diagram of a second embodiment of the differential current inductive sensor.

FIG. 7 is a schematic diagram of a second embodiment of the differential current inductive sensor. Shown in FIG. 7 are power cable 14, first power lead 16, second power lead 18, differential current inductive sensor 150, toroid core 152, toroid center region 154, secondary winding 160, resistor 162, and secondary voltage terminals 164. The descriptions of power cable 14, first power lead 16, second power lead 18, differential current inductive sensor 150, toroid core 152, toroid center region 154, secondary winding 160, resistor 162, and secondary voltage terminals 164 are substantially as provided above in regard to FIG. 6. A torrid split is not shown in FIG. 7, but can be provided in some embodiments, for example, as described above in regard to FIG. 6.

In the illustrated embodiment, power cable 14 is looped around toroid core 152 three times while passing through toroid center region 154 three times. The number of primary turns $N_P$ can be said to be three, and the resulting alternating magnetic field B for a particular value of leakage current $I_L$ will be approximately three times the value of that produced by a single pass through toroid center region 154 (e.g., as shown in FIG. 6). Accordingly, a greater value of induced secondary voltage $V_S$ can result for a given number of secondary turns $N_S$. The illustrated embodiment shown in FIG. 7 can be beneficial in providing a greater sensitivity in measuring leakage current $I_L$, thereby allowing smaller values of leakage current $I_L$ to be measured and processed by health monitoring system 40. This can improve the sensitivity of differential current inductive sensor 150 to smaller values of leakage current $I_L$, and/or improve the measurement resolution of differential current inductive sensor 150. In some embodiments, differential current inductive sensor 150 can include two primary turns $N_P$. In other embodiments, differential current inductive sensor 150 can include four or more primary turns $N_P$. For example, in a particular embodiment, the number of primary turns $N_P$ can range from about 10-20.

The embodiment shown in FIG. 7 is exemplary, and in some embodiments, practically any number of primary turns $N_P$ can be used, given various factors including, for example, the physical sizes of power cable 14 (i.e., including first and second power leads 18), and the physical size of toroid core 152. In an exemplary embodiments shown in FIGS. 6-7, first and second power leads 16, 18 can each have a wire size of 16 AWG (1.31 mm² cross-sectional area), power cable 14 can have an outside diameter (not labeled) of about 0.25 inch (6.4 mm), and toroid core 152 can have an inside diameter (not labeled) of about 0.5 inch (12.7 mm). All sizes of power cable 14 (including first and second power leads 16, 18) and toroid core 152 are within the scope of the present disclosure. Moreover, any size of wire can be used for secondary winding 60, 160. In some embodiments, power cable 14 can include more than two conductors (i.e., first and second power leads 16, 18). In these or other embodiments, power cable 14 can be sheathed (e.g., braided metallic sheath) in regions other than in the vicinity of toroid core 52, 152. It is to be appreciated that sheathed power cables 14 can be generally used for connecting a particular heater 20 to aircraft power supply 13 for various reasons (e.g., physical protection, electromagnetic shielding).

Discussion of Possible Embodiments

The following are non-exclusive descriptions of possible embodiments of the present invention.

A system for monitoring a health of a heater connected to a power supply by a power cable, the power cable comprising a first power lead conducting an inlet current defining an inlet current direction and a second power lead conducting an outlet current defining an outlet current direction, the outlet current direction being opposite to the inlet current direction, the system comprising: a differential current inductive sensor, comprising: a toroid core defining a center region, wherein the power cable is configured to pass through the center region one or more times; and a secondary winding comprising a plurality of secondary turns, the secondary winding configured to induce a secondary voltage indicative of a difference between the inlet current and the outlet current; and a prognostic processor, configured to calculate a heater health indication based on the secondary voltage; wherein: the difference between the inlet current and the outlet current defines a leakage current; and the leakage current is indicative of the heater health.

The system of the preceding paragraph can optionally include, additionally and/or alternatively, any one or more of the following features, configurations and/or additional components:

A further embodiment of the foregoing system, wherein the power cable passes through the center region once.

A further embodiment of the foregoing system, wherein the secondary winding comprises a number of secondary turns that range from 100-3000.

A further embodiment of the foregoing system, wherein the first power lead and the second power lead are twisted together.

A further embodiment of the foregoing system, wherein the heater comprises: a resistive heating element; electrical insulation surrounding the resistive heating element; and a metallic sheath surrounding the electrical insulation; wherein: the first current flows into the resistive heating element to provide heat; the second current flows out of the resistive heating element; the leakage current flows from the resistive heating element to the metallic sheath; and the first current is equal to the sum of the second current and the leakage current.

A further embodiment of the foregoing system, wherein the power cable forms two or more turns around the toroidal core, thereby passing through the center region two or more times, respectively.

A further embodiment of the foregoing system, wherein the toroid core is a ferrite toroidal core.

A further embodiment of the foregoing system, wherein the toroid core is a split toroid core, thereby allowing the differential current inductive sensor to be placed around the power cable.

A further embodiment of the foregoing system, further comprising a burden resistor configured to produce a secondary current as a result of the secondary voltage.

A further embodiment of the foregoing system, further comprising: an amplifier, configured to amplify the secondary voltage; a rectifier, configured to rectify the amplified secondary voltage; and a filter, configured to filter the rectified amplified secondary voltage, the filtered rectified amplified secondary voltage being a voltage level that is representative of the leakage current.

A further embodiment of the foregoing system, further comprising an analog-to-digital converter (ADC), configured to: produce a digital signal representative of the voltage level; and provide the digital signal to the prognostic processor; wherein the digital signal is representative of the leakage current.

A further embodiment of the foregoing system, wherein: the heater is disposed on an aircraft component; and the aircraft component disposed on an external portion of an aircraft.

A further embodiment of the foregoing system, wherein: the aircraft component is an air data probe; and the heater is configured to control ice formation on the air data probe.

A further embodiment of the foregoing system, wherein the prognostic processor is further configured to provide one or more heater health notifications, each of the one or more heater health notifications selected from the list consisting of: leakage current, heater flight hours, and heater remaining useful life.

A further embodiment of the foregoing system, wherein the prognostic processor is further configured to provide a history of the one or more heater health notifications.

A further embodiment of the foregoing system, wherein the prognostic processor comprises a neural network.

A method of providing a heater health indication of a heater connected to a power supply by a power cable, the power cable comprising a first power lead conducting an inlet current defining an inlet current direction and a second power lead conducting an outlet current defining an outlet current direction, the outlet current direction being opposite to the inlet current direction, the power cable traversing a center region of a toroid core, the toroid core including a secondary winding comprising a plurality of secondary turns disposed on the toroid core, the secondary winding configured to induce a secondary voltage indicative of a difference between the inlet current and the outlet current, the method comprising: supplying electrical power from a power source to a heater via the power cable, wherein: the inlet current flows through the first power lead; and the outlet current flows through the second power lead; and calculating, by a prognostic processor, a heater health indication based on the secondary voltage; wherein: the difference between the inlet current and the outlet current defines a leakage current; and the leakage current is indicative of the heater health indication.

The method of the preceding paragraph can optionally include, additionally and/or alternatively, any one or more of the following features, configurations and/or additional components:

A further embodiment of the foregoing method, further comprising: amplifying, by an amplifier, the secondary voltage; rectifying, by a rectifier, the amplified secondary voltage; filtering, by a filter, the rectified amplified secondary voltage, the filtered rectified amplified secondary voltage being a voltage level that is representative of the leakage current; and producing, by an analog-to-digital converter (ADC), a digital signal representative of the voltage level; wherein the digital signal is representative of the leakage current.

A further embodiment of the foregoing method, wherein: the power cable passes through the center region once; and the secondary winding comprises a number of secondary turns that range from 100-3000.

A further embodiment of the foregoing method, wherein: the heater comprises: a resistive heating element; electrical insulation surrounding the resistive heating element; and a metallic sheath surrounding the electrical insulation; the first current flows into the resistive heating element to provide heat; the second current flows out of the resistive heating element; the leakage current flows from the resistive heating element to the metallic sheath; and the first current is equal to the sum of the second current and the leakage current.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A system for monitoring a health of a heater connected to a power supply by a power cable, the power cable comprising a first power lead conducting an inlet current defining an inlet current direction and a second power lead conducting an outlet current defining an outlet current direction, the outlet current direction being opposite to the inlet current direction, the system comprising:
   a differential current inductive sensor, comprising:
      a toroid core defining a center region, wherein the power cable is configured to pass through the center region one or more times; and
      a secondary winding comprising a plurality of secondary turns, the secondary winding configured to induce a secondary voltage indicative of a difference between the inlet current and the outlet current; and
   a prognostic processor, configured to calculate a heater health indication based on the secondary voltage;
   wherein:
      the difference between the inlet current and the outlet current defines a leakage current;
      the leakage current is indicative of the heater health, and
      the prognostic processor is further configured to estimate, based on the leakage current, remaining useful life of the heater to provide on-screen the leakage current, heater, heater flight hours and the remaining useful life as outputs.

2. The system of claim 1, wherein the power cable passes through the center region once.

3. The system of claim 1, wherein the secondary winding comprises a number of secondary turns that range from 100-3000.

4. The system of claim 1, wherein the first power lead and the second power lead are twisted together.

5. The system of claim 1, wherein the heater comprises:
   a resistive heating element;
   electrical insulation surrounding the resistive heating element; and
   a metallic sheath surrounding the electrical insulation;
   wherein:
      the first current flows into the resistive heating element to provide heat;
      the second current flows out of the resistive heating element;
      the leakage current flows from the resistive heating element to the metallic sheath; and
      the first current is equal to the sum of the second current and the leakage current.

6. The system of claim 1, wherein the power cable forms two or more turns around the toroidal core, thereby passing through the center region two or more times, respectively.

7. The system of claim 1, wherein the toroid core is a ferrite toroidal core.

8. The system of claim 1, wherein the toroid core is a split toroid core, thereby allowing the differential current inductive sensor to be placed around the power cable.

9. The system of claim 1, further comprising a burden resistor configured to produce a secondary current as a result of the secondary voltage.

10. The system of claim 1, further comprising:
   an amplifier, configured to amplify the secondary voltage;
   a rectifier, configured to rectify the amplified secondary voltage; and
   a filter, configured to filter the rectified amplified secondary voltage, the filtered rectified amplified secondary voltage being a voltage level that is representative of the leakage current.

11. The system of claim 10, further comprising an analog-to-digital converter (ADC), configured to:
   produce a digital signal representative of the voltage level; and
   provide the digital signal to the prognostic processor;
   wherein the digital signal is representative of the leakage current.

12. The system of claim 1, wherein:
   the heater is disposed on an aircraft component; and
   the aircraft component disposed on an external portion of an aircraft.

13. The system of claim 12, wherein:
   the aircraft component is an air data probe; and
   the heater is configured to control ice formation on the air data probe.

14. A method of providing a heater health indication of a heater connected to a power supply by a power cable, the power cable comprising a first power lead conducting an inlet current defining an inlet current direction and a second power lead conducting an outlet current defining an outlet current direction, the outlet current direction being opposite to the inlet current direction, the power cable traversing a center region of a toroid core, the toroid core including a secondary winding comprising a plurality of secondary turns disposed on the toroid core, the secondary winding configured to induce a secondary voltage indicative of a difference between the inlet current and the outlet current, the method comprising:
 supplying electrical power from a power source to a heater via the power cable, wherein:
  the inlet current flows through the first power lead; and
  the outlet current flows through the second power lead, wherein a difference between the inlet current and the outlet current defines a leakage current;
 calculating, by a prognostic processor, a heater health indication based on the secondary voltage;
 estimating, by the prognostic processor, remaining useful life of the heater based on the leakage current, wherein the leakage current is indicative of the heater health indication; and outputting on-screen the leakage current, heater flight hours, and the remaining useful life.

15. The system of claim 1, wherein the prognostic processor is further configured to provide a history of the one or more heater health notifications.

16. The system of claim 1, wherein the prognostic processor comprises a neural network.

17. The method of claim 14, wherein:
 the heater comprises:
  a resistive heating element;
  electrical insulation surrounding the resistive heating element; and
  a metallic sheath surrounding the electrical insulation;
 the first current flows into the resistive heating element to provide heat;
 the second current flows out of the resistive heating element;
 the leakage current flows from the resistive heating element to the metallic sheath; and
 the first current is equal to the sum of the second current and the leakage current.

18. The method of claim 14, further comprising:
 amplifying, by an amplifier, the secondary voltage;
 rectifying, by a rectifier, the amplified secondary voltage;
 filtering, by a filter, the rectified amplified secondary voltage, the filtered rectified amplified secondary voltage being a voltage level that is representative of the leakage current; and
 producing, by an analog-to-digital converter (ADC), a digital signal representative of the voltage level;
 wherein the digital signal is representative of the leakage current.

19. The method of claim 14, wherein:
 the power cable passes through the center region once; and
 the secondary winding comprises a number of secondary turns that range from 100-3000.

* * * * *